(12) United States Patent
Hirst et al.

(10) Patent No.: US 7,697,882 B2
(45) Date of Patent: Apr. 13, 2010

(54) APPARATUS HAVING ACTUATING MEMBER

(75) Inventors: Mark Hirst, Boise, ID (US); Richard Lee Swantner, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1831 days.

(21) Appl. No.: 10/684,634

(22) Filed: Oct. 14, 2003

(65) Prior Publication Data
US 2005/0076942 A1 Apr. 14, 2005

(51) Int. Cl.
G03G 15/00 (2006.01)
(52) U.S. Cl. .................. 399/400; 399/320; 136/205
(58) Field of Classification Search .................. 399/320, 399/327, 330, 331, 21, 400; 361/103, 200, 361/201; 136/203–205, 208–212
See application file for complete search history.

(56) References Cited

U.S. PATENT DOCUMENTS

| 4,072,825 | A | * | 2/1978 | McLay et al. ................. 379/33 |
| 4,512,649 | A | * | 4/1985 | Derimiggio ................... 399/22 |
| 5,023,667 | A | * | 6/1991 | Negoro et al. ............... 399/317 |
| 5,419,780 | A | * | 5/1995 | Suski ......................... 136/205 |
| 5,488,467 | A | | 1/1996 | Marentes et al. |
| 5,812,906 | A | | 9/1998 | Staudenmayer et al. |
| 5,837,929 | A | | 11/1998 | Adelman |
| 5,987,295 | A | | 11/1999 | Matsuo et al. |
| 6,624,349 | B1 | * | 9/2003 | Bass ........................ 136/205 |
| 2001/0043244 | A1 | | 11/2001 | Sakuma |

* cited by examiner

*Primary Examiner*—Ren Yan

(57) ABSTRACT

One embodiment of the present invention provides an apparatus comprising a thermoelectric generator thermally coupled to an assembly having a member, wherein the thermoelectric generator is configured to convert heat from the assembly to an electrical energy. The apparatus further comprises a mechanism comprising a motor configured to actuate the member using the electrical energy.

12 Claims, 4 Drawing Sheets

APPARATUS HAVING ACTUATING MEMBER

CROSS REFERENCE TO RELATED APPLICATIONS

This patent application is related to U.S. patent application Ser. No. 10/689,464 entitled "INDICATING SYSTEM," and to U.S. patent application Ser. No. 10/685,322 entitled "IMAGING DEVICE COOLING SYSTEM," which are filed concurrently herewith and incorporated herein by reference.

BACKGROUND

Electrophotographic imaging devices, such as laser printers, fax machines, and photocopiers, are designed to produce a desired image on a print media, such as a sheet of copy paper. Electrostatic imaging devices generally include a photoconductive element that is selectively illuminated by a scanned laser beam or a light emitting diode array in response to data representative of the desired image that is to be produced, wherein the incident light generates an electrostatic copy of the desired image on the photoconductive element. The photoconductive element is then exposed to toner powder that adheres to the electrostatic copy of the desired image and is subsequently transferred from the photoconductive element to the print media. A fuser unit then fuses the "loose" toner powder to the print media.

Fuser units typically employ a combination of heat and pressure to fuse the toner powder to the print media. A fusing unit may employ a pair of opposing rollers that form a fusing nip, with one roller serving as a fuser roller and the other roller serving as a pressure roller. The fuser roller generally contacts the un-fused toner, while the pressure roller applies a pressure, or nip force, at the fusing nip to hold the print media in contact with the fuser roller. The fuser roller is generally heated while the pressure roller may or may not be heated. To fuse the looser toner to the print media, a fuser motor rotates the fuser and pressure rollers in a forward direction causing the print media to be drawn through the fusing nip, at which point the combination of pressure and heat from the rollers melts the loose toner and permanently affixes it to the print media.

The fusing nip force can significantly impact print quality. For example, if the pressure between the fuser and pressure rollers is too light, heat transfer from the fuser roller to the toner powder will be poor and the toner power will not adequately bond to the print media and cause the printed image to deteriorate. Therefore, to improve heat transfer to the toner powder, fuser units may maintain high pressure between the pressure and fuser rollers and utilize pressure rollers made of a compliant material or having an elastomeric outer layer. Unfortunately, the surfaces of these types of pressure rollers are susceptible to potentially deforming thermal sets if allowed to stay in contact with the fuser roller when an imaging device loses power and the fuser unit cools down from normal operating temperatures ranging between 150° C. to 200° C. Such thermal sets are often in the form of a flat spot on the surface of the pressure roller that can thereafter generate print defects and, thus, reduce print quality.

SUMMARY

One embodiment of the present invention provides an apparatus comprising a thermoelectric generator thermally coupled to an assembly having a member, wherein the thermoelectric generator is configured to convert heat from the assembly to an electrical energy. The apparatus further comprises a mechanism comprising a motor configured to actuate the member using the electrical energy.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

In the following detailed description of the embodiments, reference is made to the accompanying drawings which form a part hereof, and in which is shown by way of illustration specific embodiments. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
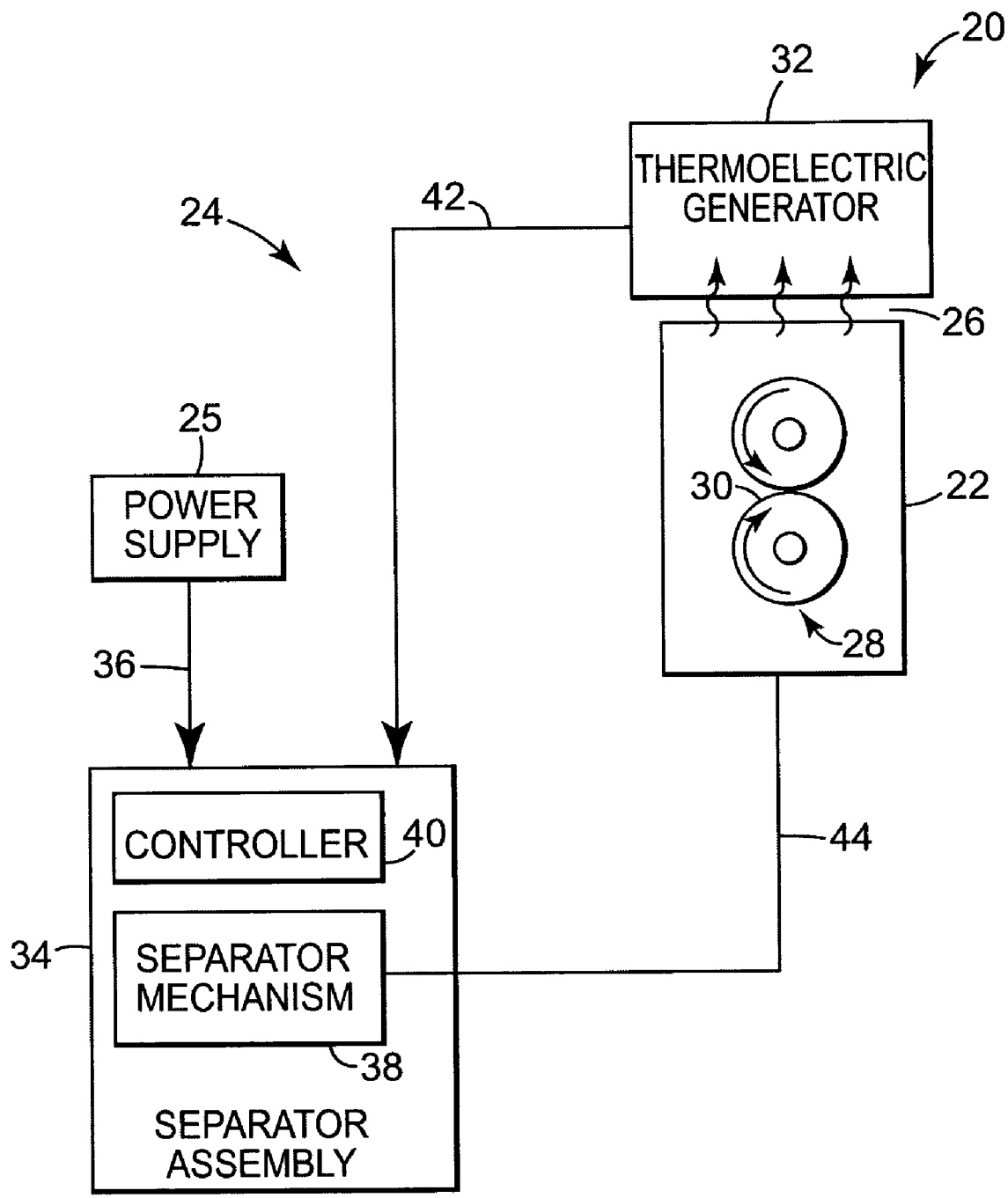
FIG. 1 is a block diagram illustrating one exemplary embodiment of a fusing system.

FIG. 1 is a diagram illustrating one exemplary embodiment of a fusing system 20. Fusing system 20 includes a fuser assembly 22, a depressurization system 24, and a power supply 25 providing a first voltage having a first voltage level. Fuser assembly 22 generates heat 26 and includes a pair of opposing platen rollers 28 pressed together to form a fusing nip 30. Depressurization system 24 includes a thermoelectric generator 32 and a separator assembly 34. Thermoelectric generator 32 is adapted to and positioned so as to be thermally coupled to fuser assembly 22 and configured to convert heat 26 from fuser assembly 22 to a second voltage.

Separator assembly 34 includes a separator mechanism 38 and a controller 40, and is configured to receive the first voltage having the first voltage level from power supply 25 via a path 36 and the second voltage from thermoelectric generator 32 via a path 42. Separator mechanism 38 is mechanically coupled to fuser assembly 22 via a linkage 44 and is configured to separate platen rollers 28.

Controller 40 is configured to monitor the first voltage level of the first voltage, and upon detecting that the first voltage level is less than or substantially equal to a threshold level to cause separator mechanism 38 to be powered by the second voltage and to separate opposing platen rollers 28. In one embodiment, when the first voltage level of the first voltage is above the threshold value, controller 40 is further configured to provide the first voltage to separator mechanism 38 and to operate separator assembly as a fuser motor to control rotation of opposing platen rollers 28 during a fusing process.

While power supply 25 and thermoelectric generator 32 are illustrated in the embodiment of FIG. 1 as providing a voltage level, power supply 25 and thermoelectric generator 32 can each provide an electrical energy comprising a plurality of parameter levels including current and power. In one embodiment, power supply 25 is a power supply of an imaging device in which fusing system 20 is included.

By utilizing heat from fuser assembly 22 that would otherwise be wasted to power separator assembly 34, fusing system 20 employing depressurizing system 24 can separate opposing platen rollers 28 without using electrical energy from an external power source. Fusing system 20 employed in an imaging device is capable of separating the platen rollers even if power is lost to the imaging device and, therefore, does not make use of chemical batteries and other special or auxiliary power supplies. Depressurizing system 24 can also be adapted to operate with fusing systems already employed in some conventional imaging system designs. Thus, fusing system 20 can provide a simple and economical depressurization scheme for reducing the possibility of damage to fuser assembly platen rollers associated with loss of fusing system power.

In one embodiment, thermoelectric generator 32 comprises a Peltier device operating in a Seebeck mode to generate a voltage to for separating opposing platen rollers 28. In a Peltier device comprising a series loop formed by joining two wires of different material, a current is circulated through the loop in one direction causing one junction to generate heat (become hot) and the other junction to absorb heat (become cool). When the current is circulated in the opposite direction, the heat generating and absorbing junctions are reversed. While Peltier devices are best known as thermoelectric coolers, they can also function as thermoelectric generators. That is, when a temperature differential is applied across the junctions, the Peltier device generates a DC voltage between the junctions. This mode of operation is known as the Seebeck mode. Peltier devices may be comprised of heavily doped series-connected semiconductor segments, as described, for example, by Brun et al., U.S. Pat. No. 4,929,282; Cauchy, U.S. Pat. No. 5,448,109; and Chi et al., U.S. Pat. No. 5,714, 791.

Figure 2:
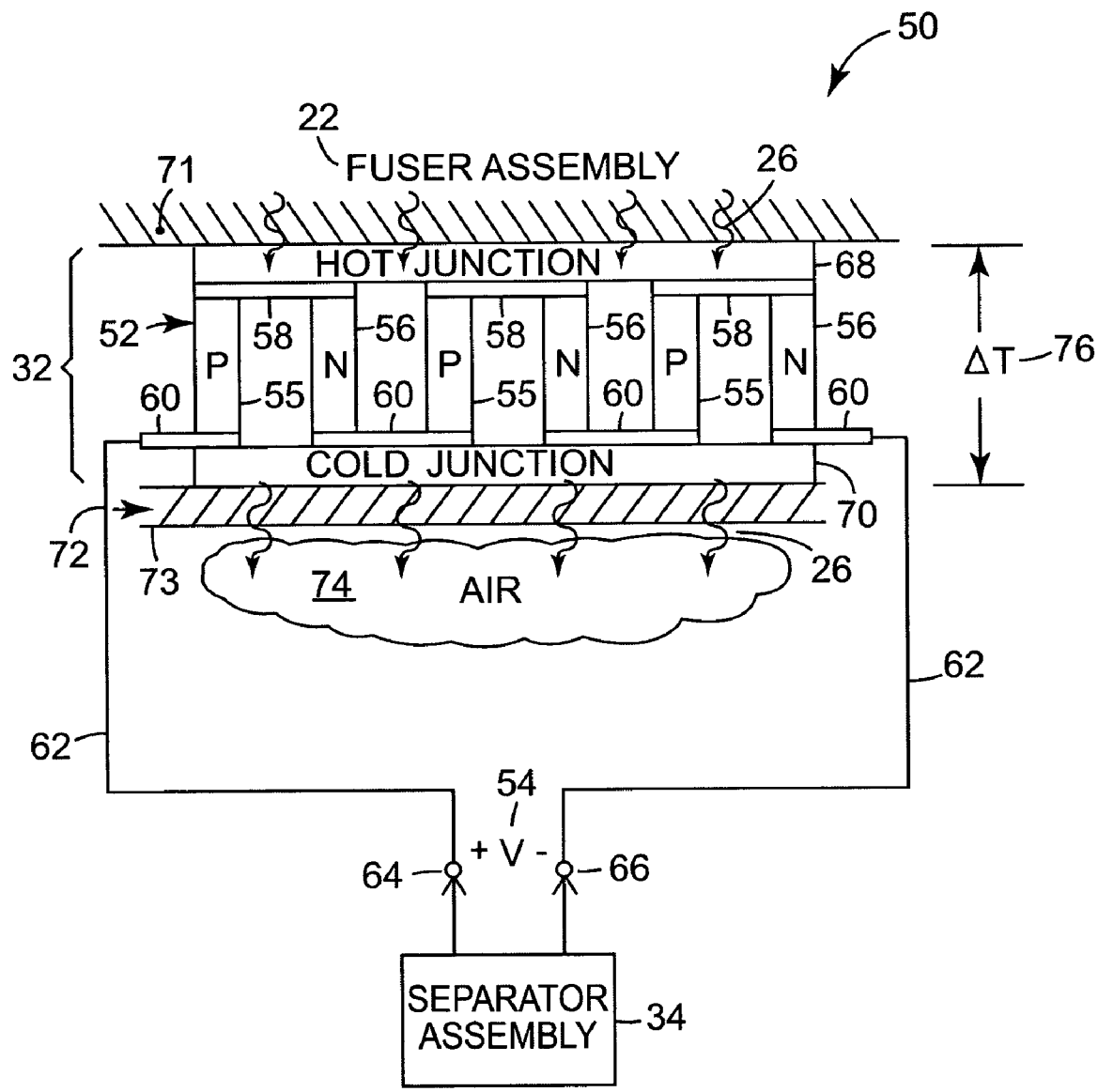
FIG. 2 is a diagram illustrating one exemplary embodiment of a thermoelectric generator employed by a depressurization system.

FIG. 2 illustrates at 50 one exemplary embodiment thermoelectric generator 32 as employed by fusing system 20, wherein thermoelectric generator 32 comprises a Peltier device 52, as described above, operating in the Seebeck mode to generate an output voltage 54 to power separator assembly 34. Peltier device 52 comprises a plurality of p-doped semiconductor segments 55 and a plurality of n-doped semiconductor segments 56, each segment having a first and a second end. N-doped segments 56 create an excess of electrons, while p-doped segments 55 create a deficiency of electrons. P-doped segments 55 and n-doped segments 56 are connected in an alternating series fashion, with their first ends connected by a first plurality of conductor segments 58 and their second ends connected by a second plurality of conductor segments 60, wherein the first and second pluralities of conductor segments 58 and 60 comprise an electrically conductive materials such as copper. The first and last conductor segment of the plurality of conductor segments 60 are connected to a pair of wires 62 to provide output voltage 54 at a pair of output terminals 64 and 66. Separator assembly 34 is coupled to terminals 64 and 66 to receive output voltage 54.

The first plurality of conductor segments 58 is coupled to a hot junction 68 and the second plurality of conductor segments 60 is coupled to a cold junction 70. Hot junction 68 and cold junction 70 comprise a material that is highly thermally conductive, but electrically non-conductive, including a ceramic material such as alumina or aluminum nitride. Hot junction 68 is thermally coupled to a housing 71 of fuser assembly 22. In one embodiment, cold junction 70 is thermally coupled to an internal surface of a housing 72 of an imaging device in which fuser system 20 is included, such as imaging device 34, wherein an external housing surface 73 is in contact with air 74 at an ambient room temperature. In one embodiment, thermoelectric generator 32 is mechanically coupled to housing 72 such that cold junction 70 is thermally coupled to housing 72. Essentially, fuser assembly 22 functions as a heat source transferring heat 26 to hot junction 68, while imaging device housing 72 functions as a heat sink transferring heat 26 from cold junction 70 to air 74.

In operation, the temperature of fuser assembly 22 is greater than the temperature of air 74, thereby creating a temperature differential 76 between hot junction 68 and cold junction 70. The temperature differential, in accordance with the Seebeck Effect, results in Peltier device 52 generating output voltage 54 between terminals 64 and 66 to power separator assembly 34. Output voltage 54 is proportional to temperature differential 76, with an increase in temperature differential 76 resulting in an increase in output voltage 54.

Figure 3:
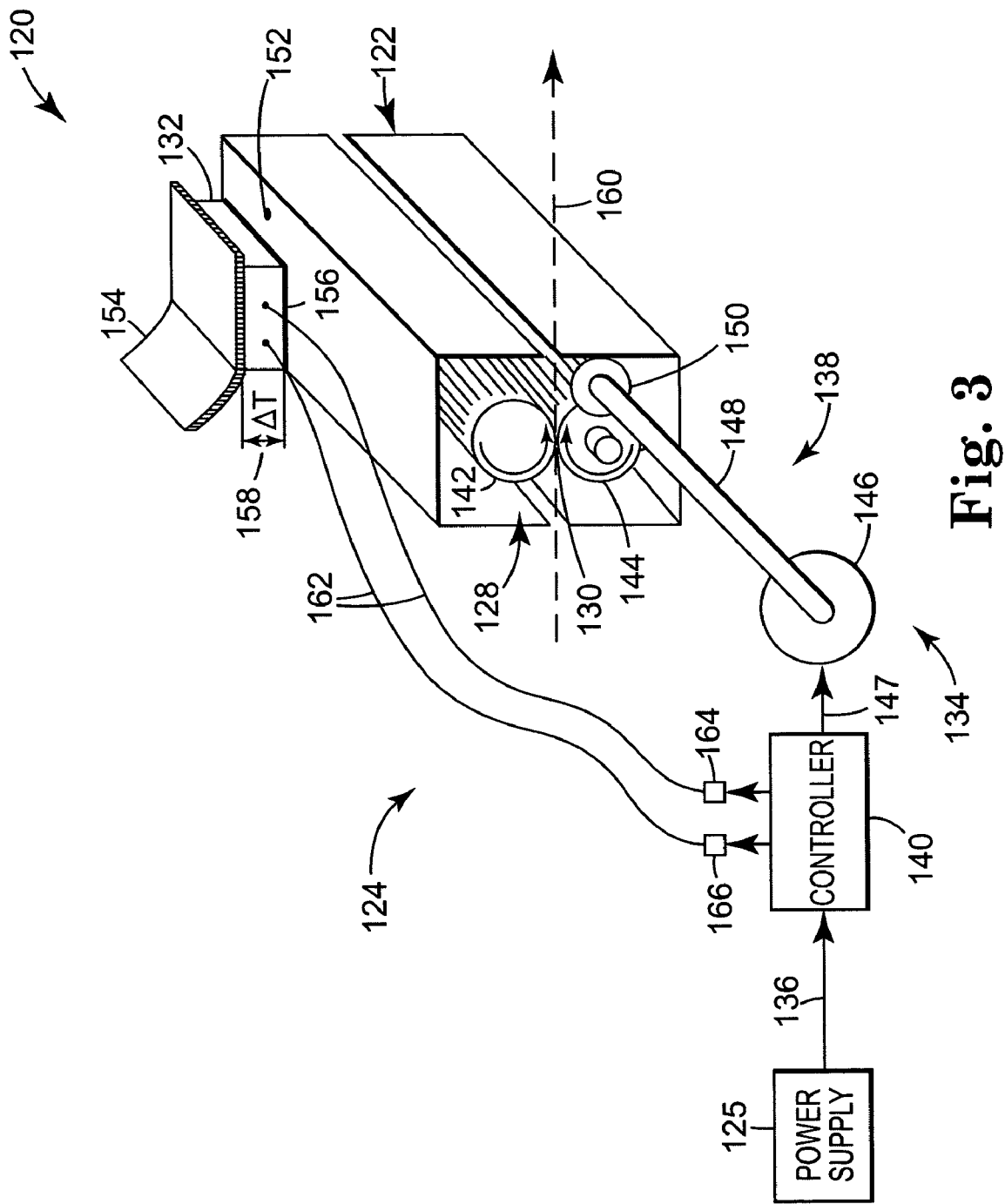
FIG. 3 is a block and schematic diagram illustrating one exemplary embodiment of a fusing system.

FIG. 3 illustrates in block and schematic form a more detailed embodiment of a fuser system 120. Fuser system 120 includes a fuser assembly 122, a depressurization system 124 and a power supply 125. Fuser assembly 122 further includes a pair of opposing platen rollers 128 pressed together to form a fusing nip 130, with one roller being a fuser roller 142 and the other being a pressure roller 144.

Depressurization system 124 includes a thermoelectric generator 132 and a separator assembly 134. Separator assembly 134 further comprises a separator mechanism 138, and a controller 140 configured to receive from power supply 125 via a path 136 a first voltage having a first voltage level. Separator mechanism 138 includes a fuser motor 146 electrically coupled to controller 140 via a path 147 and mechanically coupled to fuser assembly 122 via a linkage 148 and a cam 150, and is configured to separate opposing platen rollers 128. Cam 150 is configured to allow free rotation of the platen rollers when each of the platen rollers is rotated in a forward direction, as indicated by the rotational arrows, and configured to engage and separate fuser roller 142 from pressure roller 144 when each of the platen rollers is rotated in a reverse direction, opposite the direction of the rotational arrows as shown.

Thermoelectric generator 132 has a first surface thermally coupled to a housing 152 of fuser assembly 122 and a second surface mechanically and thermally coupled to a housing 154 of an imaging system in which fuser system 120 in included, such as a laser printer or fax machine. A heat conducting elastomer 156 is adhered to the first surface of thermoelectric generator 132 and configured to contact housing 152 of removable fuser assembly 122 to improve heat transfer from fuser assembly 122 to thermoelectric generator 132. In one embodiment, thermoelectric generator 132 has a first surface mechanically and thermally coupled to housing 152 of fuser assembly 122 and a second surface thermally coupled to housing 154, with heat conducting elastomer 156 being positioned between the second surface and housing 154.

During a fusing operation, a print media is passed through fusing nip 130 along a media path 160. For proper fusing, fuser roller 142 is typically maintained at a temperature between 150° C. and 200° C., with fuser assembly housing 152 often having a temperature in excess of 100° C., while imaging device housing 154 is typically ranges between 20° C. and 40° C. This results in a temperature gradient 158 being created across thermoelectric generator 132, with temperature gradient 158 often having a value of at least 60° C. Thermoelectric generator 132 converts temperature gradient 158 to a second voltage provided to controller 140 via a pair of wires 162 and terminals 164 and 166.

Controller 140 monitors the first voltage level of the first voltage at 136. When the first voltage level of the first voltage is above a threshold level, controller 140 provides the first voltage to fuser motor 146 via a path 147. In response to the first voltage, fuser motor 146 causes fuser roller 142 and pressure roller 144 to rotate in a forward direction, as indicated by the rotational arrows, and feed a piece of print media through fusing nip along a media path 160. When fuser motor 146 is powered by the first voltage, controller 140 is further configured to cause fuser motor 146 to drive each of the opposing platen rollers 128 in a reverse direction when print media becomes jammed in fuser assembly 122 or when the imaging device in which fuser system 120 is included is powered-off, thereby causing cam 150 to separate fuser roller 142 from pressure roller 144.

Upon detecting that the first voltage level of the first voltage at 136 is less than or substantially equal to the threshold value, controller 140 provides the second voltage from thermoelectric generator 132 to fuser motor 146 via path 147. In response to the second voltage, fuser motor 146 causes each of the platen rollers 128 to rotate in the reverse direction, thereby causing cam 150 to engage and separate fuser roller 142 from pressure roller 144.

Figure 4:
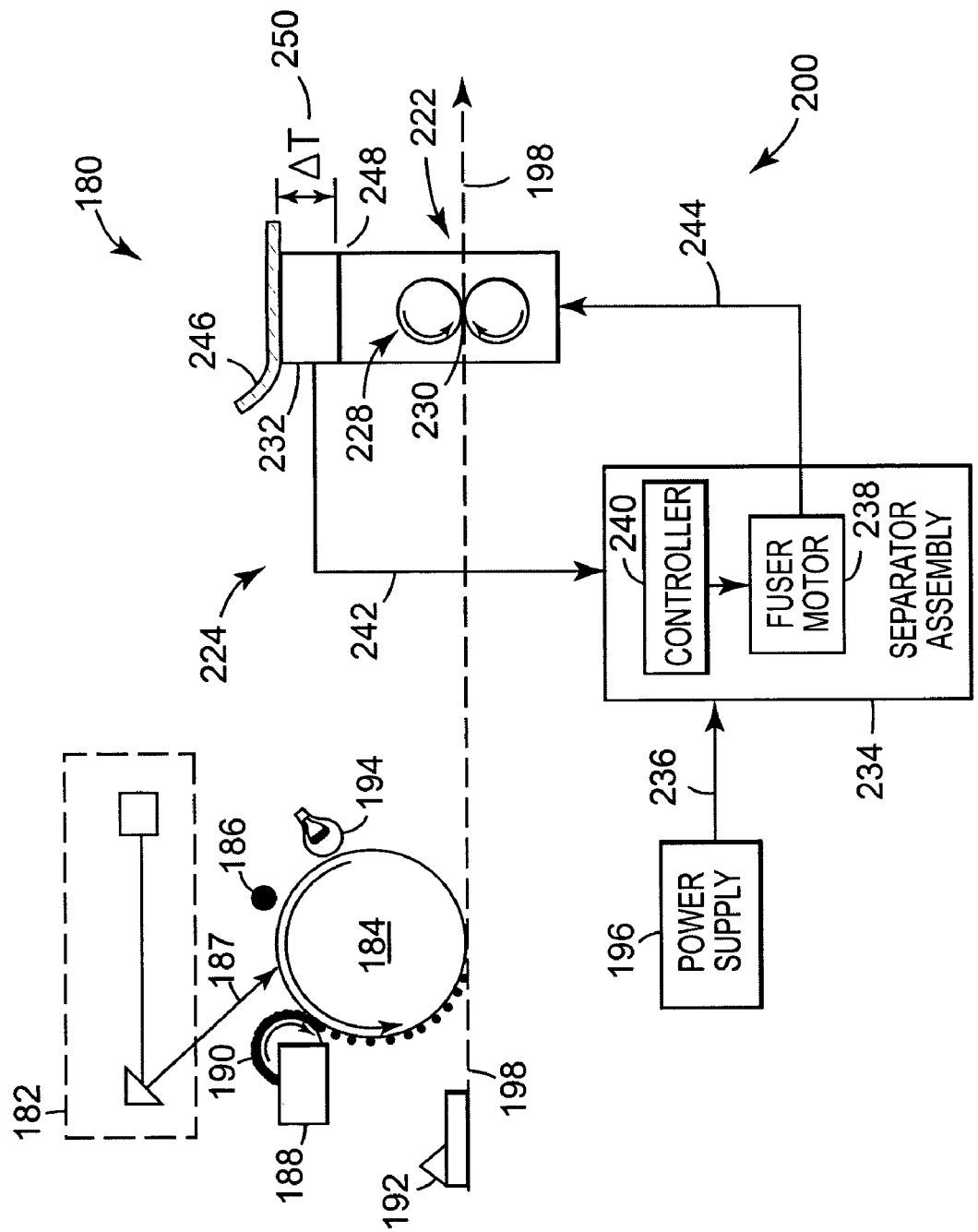
FIG. 4 is a block and schematic diagram illustrating one exemplary embodiment of a laser printer.

FIG. 4 illustrates one exemplary embodiment of a laser printer 180. Laser printer 180 includes a fusing system 200 that converts heat emitted by a fuser assembly into electrical energy to power depressurizing system 224 for separating fuser assembly platen rollers upon loss of power to the laser printer. Laser printer 180 includes a laser scanning unit 182, a photoconductive drum, 184, a charging station 186, a toner hopper 188, a developer roller 190, a print media source 192, a discharge lamp 194, a power supply 196, and a fusing system 200 according to the present invention.

Fusing system 200 includes a fuser assembly 222 and a depressurization system 224. Fuser assembly 222 includes a pair of opposing platen rollers 228 pressed together to form a fusing nip 230. Depressurization system 224 includes a thermoelectric generator 232 and a separator assembly 234 which is configured to receive from printer power supply 196 at 236 a first voltage having a voltage level. Separator assembly 234 includes a controller 240 and a fuser motor 238 coupled to fuser assembly 222 via a linkage 244. Separator assembly 234 is configured to separate opposing platen rollers 228 when each of the platen rollers is rotated in a reverse direction (the reverse of the rotational arrows as shown in FIG. 4) and to allow opposing platen rollers 228 to remain in contact when each of the platen rollers 228 is rotated in a forward direction, as indicated by the rotational arrows in FIG. 4.

To produce a desired image, the surface of photoconductive drum 184 is first given a total positive charge by charging station 186. Laser scanning unit 182 then selectively illuminates photoconductive drum 184 with a light beam 187 that is representative of the desired image. As photoconductive drum 184 rotates, light beam 187 discharges the incident surface of photoconductive drum and creates an electrostatic copy of the desired image on the surface of photoconductive drum 184. As photoconductive drum rotates, developer roller 190 applies toner powder from toner hopper 188 to the surface of photoconductive drum 184, whereby the "loose" toner powder clings to the electrostatic copy of the desired image on the drum's surface. A piece of print media is fed from print media source 192 along a media path 198, and the loose toner powder in the form of the desired image is transferred from the surface of photoconductive drum 184 to a surface of the print media as it is fed past the drum. Discharge lamp 194 then "erases" the electrostatic copy of the desired image from the surface of photoconductive drum 184.

The print media continues along media path 198 to fuser assembly 222 where it passes through fusing nip 230. At least one of the opposing platen rollers 228 is heated and contacts the loose toner powder on the print media surface causing the toner powder to melt and adhere to the print media. The pressure at fusing nip 230 holds the print media in place, improves heat transfer with the toner powder, and imparts a smooth and even finish to the surface of the fused toners.

Thermoelectric generator 232 has a first surface thermally coupled to fuser assembly 222 and a second surface mechanically and thermally coupled to a housing 246 of laser printer 180. A heat conductive elastomer 248 is adhered to the second surface of thermoelectric generator 232 and is configured to contact fuser assembly 222 to improve heat transfer between fuser assembly 222 and thermoelectric generator 232. Heat conductive elastomer 248 is further configured to make contact with fuser assembly 222 while still allowing fuser assembly 222 to be removed/replaced independently from the remainder of fusing system 200.

The heating of at least one of the platen rollers 228 creates a temperature gradient 250 between fuser assembly 222 and printer housing 246, and thus across thermoelectric generator 232. Typically, fuser assembly 222 is at a temperature in excess of 100° C. while printer housing 246 ranges in temperature from 20° C. to 40° C., resulting in temperature gradient 250 typically having a value of at least 60° C. Thermoelectric generator 232 converts temperature gradient 250 to a second voltage provided to separator assembly 234 via a path 242.

Controller 240 is configured to monitor the level of the first input voltage provided by power supply 196 at 236. When the level of the first input voltage is above a threshold level, controller 240 provides the first input voltage to fuser motor 238 which, in response, causes platen rollers 228 to rotate in the forward direction and transport a piece of print media through fusing nip 230 along media path 198. Additionally, when the level of the first input voltage is above a threshold level, controller 240 is further configured to cause fuser motor 238 to rotate each of the platen rollers 228 in the reverse direction when print media becomes jammed in fuser assembly 222 or laser printer 180 is powered-off, to thereby cause platen rollers 228 to separate.

Controller 240, upon detecting that the voltage level of the first voltage input at 236 is less than or substantially equal to the threshold value, provides the second voltage received from thermoelectric generator 232 to fuser motor 238. In response to the second voltage, fuser motor 238 causes each of the opposing platen rollers 228 to rotate in the reverse direction to thereby cause platen rollers 228 to separate.

Laser printer 180 employing a depressurization system 224 utilizes waste heat generated by a fuser assembly to separate the fuser assembly platen rollers. Therefore, even after a loss of system power, laser printer 180 can separate the platen rollers and avoid potentially harmful thermal setting of the platen rollers without the use of chemical-based batteries or special auxiliary power supplies. Furthermore, as illustrated above, depressurization system 224 can be adapted to operate with fusing systems employed by some types of laser printers and other imaging systems.

Although specific embodiments have been illustrated and described, it will be appreciated by those of ordinary skill in the art that a wide variety of alternate and/or equivalent implementations may be substituted for the specific embodiments shown and described without departing from the scope of the present invention. Those with skill in the chemical, mechanical, electro-mechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. An apparatus comprising:
   a thermoelectric generator thermally coupled to a fuser assembly having a member and a pair of platen rollers pressed together to form a fusing nip, the thermoelectric generator configured to convert heat from the fuser assembly to an electrical energy; and
   a mechanism comprising a motor configured to actuate the member using the electrical energy, wherein the member is configured to separate the platen rollers when actuated by the motor;
   wherein the apparatus is powered via a normal energy source and further comprises:
   a controller configured to monitor the normal energy source compared to a threshold parameter level, and to selectively power the motor to actuate the member via the electrical energy to separate the platen rollers in response to the monitored normal energy source having a parameter level less than or substantially equal to the threshold parameter level.

2. The apparatus of claim 1, wherein the motor is configured to operate as a fuser motor when the apparatus is powered via the normal energy source.

3. The apparatus of claim 1, wherein the threshold parameter is a voltage level.

4. The apparatus of claim 1, wherein the thermoelectric generator comprises:
   a Peltier device operating in a Seebeck mode.

5. An imaging system comprising:
   a power supply configured to provide a first electrical energy having a first parameter level;
   a fuser assembly that generates heat and comprises:
   a pair of opposing platen rollers supported by a housing and pressed together to form a fusing nip; and
   a depressurization system comprising:
   a thermoelectric generator adapted to thermally couple to the fuser assembly and configured to convert heat from the fuser assembly to a second electrical energy; and
   a separator assembly configured to receive the first electrical energy having the first parameter level and the second electrical energy, the separator assembly comprising:
   a separator mechanism mechanically coupled to the fuser assembly and configured to separate the platen rollers; and
   a controller configured to monitor the first parameter level of first electrical energy, to normally power the separator mechanism from with the first electrical energy, and upon detecting that the first parameter level is less than or substantially equal to a threshold level to cause the separator mechanism to be powered by the second electrical energy to thereby separate the platen rollers.

6. The imaging system of claim 5, wherein the threshold level is substantially equal to zero.

7. The imaging system of claim 5, wherein the first and second energy levels each comprise a voltage.

8. The imaging system of claim 5, wherein the thermoelectric generator comprises:
   a first surface mechanically and thermally coupled to a frame of the imaging system; and
   a second surface thermally coupled only to the fuser assembly housing to thereby allow removal of the fuser assembly from the imaging device.

9. The imaging system of claim 8, wherein the thermoelectric generator comprises:
   a Peltier device operating in a Seebeck mode.

10. The imaging system of claim 9, wherein the first surface comprises a cold junction and the second surface comprises a hot junction.

11. The imaging system of claim 8, wherein the first surface is thermally coupled only to the frame and the second surface is mechanically and thermally coupled to the fuser assembly to thereby allow removal of the fuser assembly and associated thermoelectric generator from the imaging device.

12. An imaging system comprising:
    a power supply configured to provide a first electrical energy having a first parameter level;
    a fuser assembly that generates heat and comprises:
    a pair of opposing platen rollers supported by a housing and pressed together to form a fusing nip; and
    a depressurization system comprising:
    a thermoelectric generator adapted to thermally couple to the fuser assembly and configured to convert heat from the fuser assembly to second electrical energy; and
    a separator assembly configured to receive the first electrical energy having the first parameter level and the second electrical energy, the separator assembly comprising:
    a separator mechanism mechanically coupled to the fuser assembly and configured to separate the platen rollers in response to the second electrical energy; and
    a controller configured to monitor the first parameter level of first electrical energy and upon detecting that the first parameter level is less than or substantially equal to a threshold level to cause the separator mechanism to be powered by the second electrical energy to thereby separate the platen rollers;
    wherein the thermoelectric generator comprises:
    a first surface mechanically and thermally coupled to a frame of the imaging system; and
    a second surface thermally coupled only to the fuser assembly housing to thereby allow removal of the fuser assembly from the imaging device, wherein a heat conductive elastomer is positioned between the second surface and the fuser assembly housing and adhered to only the second surface so as to contact the fuser assembly.

* * * * *